United States Patent
Gallagher et al.

(10) Patent No.: US 7,537,114 B2
(45) Date of Patent: May 26, 2009

(54) SYSTEM AND METHOD FOR STORING AND TRANSPORTING PHOTOMASKS IN FLUID

(75) Inventors: Emily F. Gallagher, Burlington, VT (US); Louis M. Kindt, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 11/275,694

(22) Filed: Jan. 25, 2006

(65) Prior Publication Data
US 2007/0172743 A1 Jul. 26, 2007

(51) Int. Cl.
B65D 85/38 (2006.01)
G03F 1/00 (2006.01)
G03C 11/00 (2006.01)
H01L 21/00 (2006.01)

(52) U.S. Cl. .................. 206/316.1; 430/5; 430/644; 438/800

(58) Field of Classification Search .............. 430/5, 430/644; 206/316.1; 438/800
See application file for complete search history.

(56) References Cited

U.S. PATENT DOCUMENTS

| | | | | |
|---|---|---|---|---|
| 5,353,934 A | * | 10/1994 | Yamauchi | 206/454 |
| 5,397,665 A | * | 3/1995 | Tabuchi et al. | 430/5 |
| 5,634,980 A | * | 6/1997 | Tomita et al. | 134/3 |
| 5,938,860 A | | 8/1999 | Williams | |
| 6,029,371 A | | 2/2000 | Kamikawa et al. | |
| 6,513,654 B2 | | 2/2003 | Smith et al. | |
| 6,555,834 B1 | | 4/2003 | Loopstra | |
| 6,635,390 B1 | | 10/2003 | Badger et al. | |
| 6,869,733 B1 | | 3/2005 | Su | |
| 2003/0227605 A1 | | 12/2003 | del Puerto et al. | |
| 2004/0109152 A1 | | 6/2004 | Hirayanagai | |
| 2004/0109153 A1 | | 6/2004 | Vroman et al. | |
| 2004/0137339 A1 | | 7/2004 | Zhang et al. | |
| 2004/0145716 A1 | | 7/2004 | Wu et al. | |
| 2004/0191649 A1 | | 9/2004 | Dao et al. | |
| 2005/0106475 A1 | | 5/2005 | Schroeder et al. | |

FOREIGN PATENT DOCUMENTS

JP P2001-53136 A * 2/2001

OTHER PUBLICATIONS

Machine Translation of P2001-531136A, 13 pages.*

* cited by examiner

*Primary Examiner*—Evan Pert
(74) *Attorney, Agent, or Firm*—DeLio & Peterson LLC; Peter W. Peterson; Richard M. Kotulak

(57) ABSTRACT

An apparatus for and method of storing and transporting a photomask. A photomask storage container has fluid-tight walls, an opening for moving the photomask into and out of the container, and a sealable inlet for a storage fluid. The method includes placing the photomask in the storage container through the opening, introducing a storage fluid into the container through the inlet, closing the container opening and sealing the storage fluid inlet, whereby the storage fluid is essentially inert with respect to the photomask. The method then includes opening the container opening and contacting a surface of the photomask with an alcohol-containing gas while removing the photomask from the storage container to remove the storage fluid from the photomask surface.

31 Claims, 2 Drawing Sheets

SYSTEM AND METHOD FOR STORING AND TRANSPORTING PHOTOMASKS IN FLUID

BACKGROUND OF THE INVENTION

1. Field of the Invention

The present invention relates generally to lithographic production of microelectronic circuits or other features and, more particularly, to a method and apparatus for storing and transporting masks used in lithographic production.

2. Description of Related Art

In manufacturing integrated circuits and other features using lithographic techniques, it is a goal to build a defect-free reticle or photomask with the desired patterns which then are projected and exposed onto the resist layers on a wafer during lithographic processing to create the circuits. Particle contaminants on reticles or photomasks can cause problems during lithographic imaging. Particles on the front (patterned) side of the mask are imaged on the water and will cause yield loss. This problem has been mitigated in the past by placing a protective pellicle over the front side of the mask, so that any particles are deposited on the pellicle instead of the mask itself. The pellicle is transparent to the exposure wavelength and keeps particles out of focus so that they do not image on wafers. Particles on the back side of the mask are unlikely to image, because they are already 0.25 in. (6.35 mm) away from the focal plane. However, even these back-side particles are undesirable since large ones may alter the exposure light, and because the particles could move to other undesired locations. An additional concern is introduced by small particles which can form a haze that can alter mask transmission. For applications requiring back-side chucking, particles may lead to chucking non-flatness. For lithographic systems using exposure wavelengths beyond the current 193 nm generation, such as 157 nm, 13.4 nm Extreme Ultraviolet, and ~1 nm X-ray there is no known pellicle solution that is simultaneously transparent to the exposure energy and protective. Similarly, there is no pellicle solution for lithographic exposure systems using particle beams such as the electrons used in Electron Projection Lithography (EPL) and Low Energy Electron Projection Lithography (LEEPL) or the ions used in Ion Project Lithography (IPL).

An emerging problem in particular is contaminants that are adsorbed on the surface of the mask, such as sulfates and ammonia. At the high-energy exposure conditions used in the advanced steppers, these contaminants can form particles that grow large enough to print on the wafer. The contaminants may be airborne in origin, or introduced to the mask surface during manufacture, transportation and storage. Recent analyses have shown that, even after rinsing by ultra-pure water (UPW) with dissolved hydrogen and ozone, significant surface contamination by organics, fluorinated compounds, sulfur compounds and siloxanes is still able to develop. Such surface contamination is largely from external sources, believed to be airborne contamination introduced after the cleaning.

Current storage pods for masks have a filter to minimize influences from external airborne particles, but not from the chemical contamination. A method for eliminating particles as well as adsorbed contaminants on the surface of the mask without the protective pellicle is needed.

SUMMARY OF THE INVENTION

Bearing in mind the problems and deficiencies of the prior art, it is therefore an object of the present invention to provide an improved system and method for storing and transporting photomasks used for lithographic production of microelectronic circuits.

It is another object of the present invention to provide a system and method for storing and transporting photomasks that significantly reduces mask surface contaminants.

A further object of the invention is to provide a system and method for storing and transporting photomasks that permits extended periods of storage without recharging of a storage fluid.

It is yet another object of the present invention to provide a system and method for storing photomasks that cleans the mask surfaces as it is removed from the storage fluid.

Still other objects and advantages of the invention will in part be obvious and will in part be apparent from the specification.

The above and other objects, which will be apparent to those skilled in the art, are achieved in the present invention which is directed to a method of storing and transporting a photomask comprising providing a photomask storage container having fluid-tight walls, an opening for moving the photomask into and out of the container, and a sealable inlet for a storage fluid, and placing the photomask in the storage container through the opening. The method then includes introducing a storage fluid into the container through the inlet, closing the container opening and sealing the storage fluid inlet, whereby the storage fluid is essentially inert with respect to the photomask.

The storage container preferably includes a sealable fluid outlet, and the method includes expelling gas from the storage container as the storage fluid is introduced into the storage container and subsequently sealing the outlet. There may be further provided with the storage container a filter for the storage fluid, and the method includes filtering out contaminants from the storage fluid as the fluid is introduced into the storage container. The filter is preferably associated with the inlet, and contaminants are filtered out from the storage fluid as it is introduced into the storage container.

The method may further include, prior to introducing the storage fluid, contacting a surface of the photomask with an agent to alter properties of the mask surface, for example, to render the mask surface more hydrophilic or to alter zeta properties of the mask surface.

The storage container may further include a material attractive to photomask contaminants, for example, aluminum oxide, and the method may include applying an electrical charge between the photomask and the attractive material to attract photomask contaminants to the material.

In another aspect, the present invention is directed to a method of transporting a photomask comprising providing a photomask storage container having fluid-tight walls and an opening for moving the photomask into and out of the container, and providing in the photomask storage container a photomask and a storage fluid around the photomask, the storage fluid being essentially inert with respect to the photomask. The method then includes opening the container opening and contacting a surface of the photomask with an alcohol-containing gas while removing the photomask from the storage container to remove the storage fluid from the photomask surface.

The method may further include maintaining a flow of the gas against the photomask surface during the removal of the photomask from the storage container, and maintaining a differential in concentration of the alcohol-containing gas between the mask surface and a distance below a surface of the storage fluid.

The storage container may include a fluid port, and the method may include introducing a liquid into the storage container prior to removing the photomask from the storage container to remove any particles that may have settled in the container.

The storage fluid preferably comprises a liquid such as water, which may include additives to increase electrical conductivity or change surface properties of the water. The additives include ammonia, potassium sulfate, aluminum chloride and combinations thereof.

In a further aspect, the present invention is directed to an apparatus for storing and transporting a photomask comprising a photomask storage container having fluid-tight walls, an opening for moving the photomask into and out of the container, and a sealable inlet for a storage fluid. The photomask may be placed in the storage container through the opening and a storage fluid may be introduced into the container through the inlet to provide an environment around the photomask essentially insert with respect to the photomask and essentially free of photomask contaminant.

The apparatus preferably includes edge protectors for spacing the photomask from interior walls of the storage container to permit the storage fluid to maximize contact area with the surfaces of the photomask.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both its design and method of operation, may best be understood by reference to the detailed description which follows taken in conjunction with the accompanying drawings in which:

DESCRIPTION OF THE PREFERRED EMBODIMENT(S)

Figure 1:
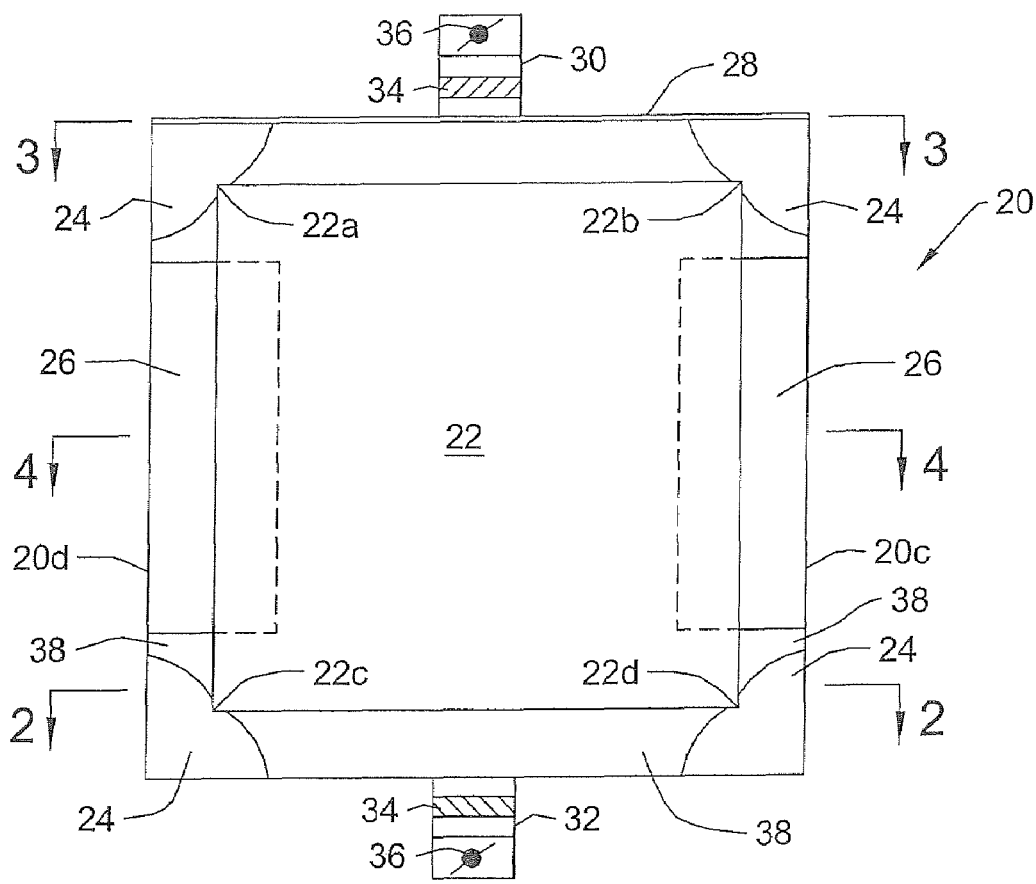
FIG. 1 is a front, cross-sectional, elevational view of the preferred embodiment of the photomask storage container of the present invention.
Figure 2:
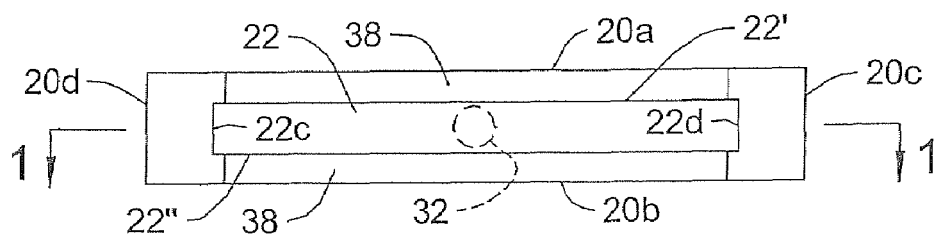
FIG. 2 is a sectional view of the photomask storage container along lines 2-2 of FIG. 1.
Figure 3:
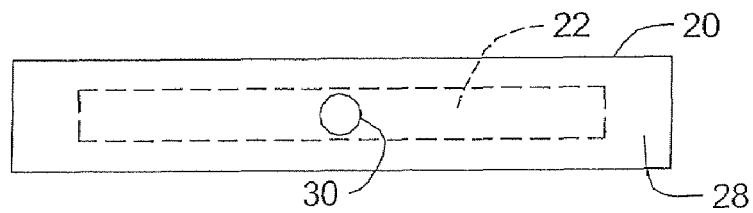
FIG. 3 is a top plan view of the photomask storage container of FIG. 1.
Figure 4:
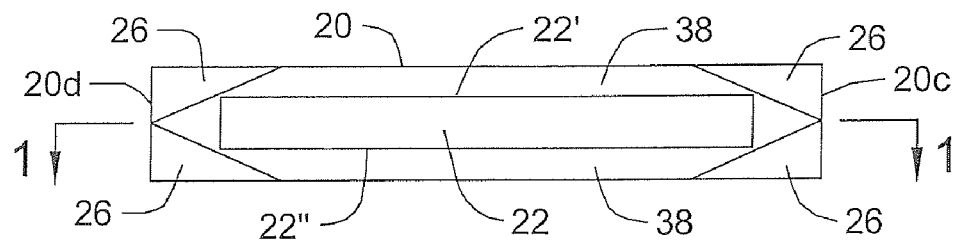
FIG. 4 is a sectional view of the photomask storage container along lines 3-3 of FIG. 1.
Figure 5:
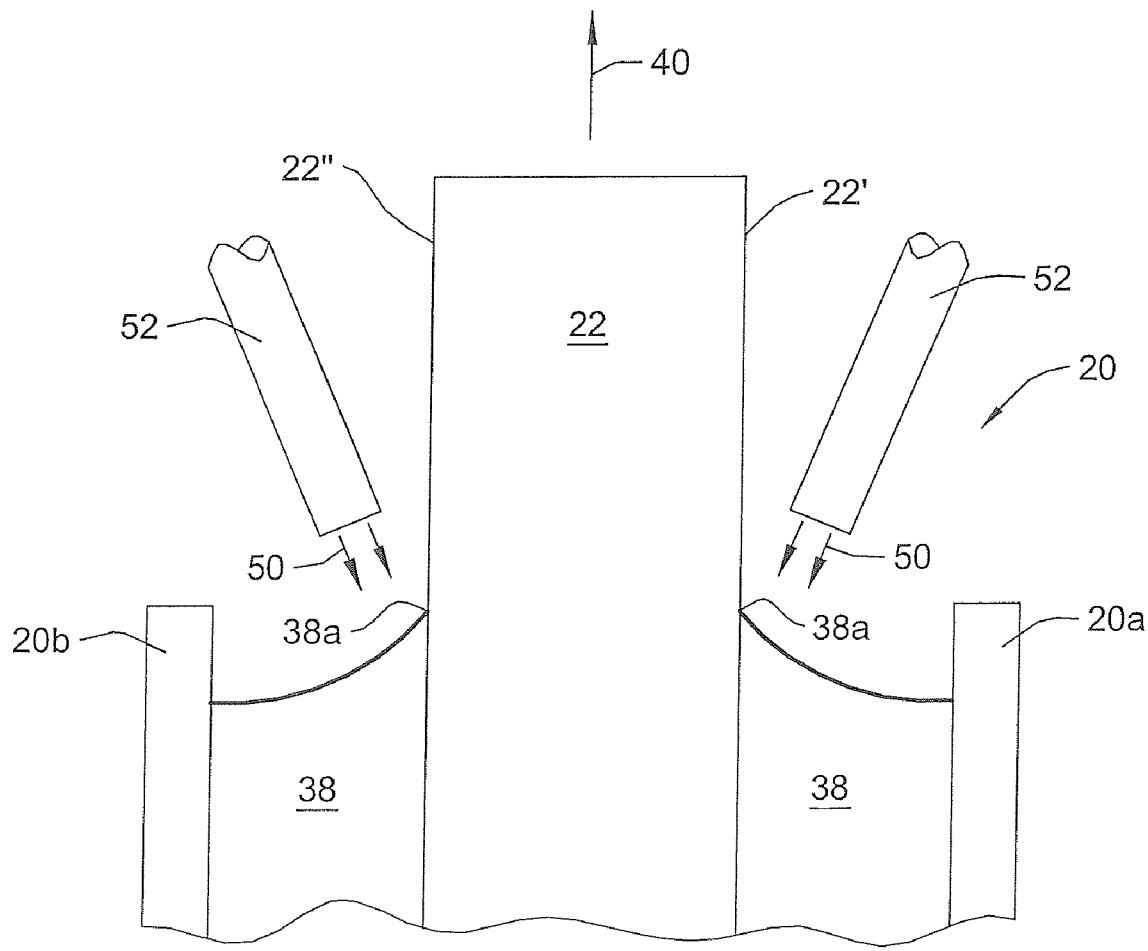
FIG. 5 is a side elevational view of the top portion a photomask being withdrawn from the photomask storage container of FIG. 1 in accordance with the preferred method of the present invention.

In describing the preferred embodiment of the present invention, reference will be made herein to FIGS. 1-5 of the drawings in which like numerals refer to like features of the invention.

The present invention provides a means and method to transport and store the reticle or photomask in a fluid environment. This environment may be introduced once the mask has completed processing and inspection and is ready to ship to a lithographic fabrication facility. Before use in a stepper, the mask may be slowly pulled from its fluid storage bath while a gas phase containing a low concentration of an alcohol is introduced to the process chamber. This forces the fluid, and any particles that may exist, away from the mask surface. This preferably is done as close as possible to the exposure mask chuck, more preferably in the same environment as the stepper. If necessary, a UV/Ozone clean may be performed on the mask prior to exposure to remove any trace organics left from the alcohol drying process.

In order to use fluid for the mask storage environment, the present invention provides a reticle or photomask storage box that is fluid-tight and compatible with the storage fluid, and that provides for facile removal and cleaning of the mask so that it is ready for exposing wafers. Both are addressed in this disclosure.

A preferred embodiment of the carrying case or box 20 for a photomask is depicted in FIGS. 1, 2, 3 and 4. Box 20 is sized sufficiently to hold the desired photomask, which typically has dimensions of 6 in.×6 in.×0.25 in (152.4 mm×152.4 mm×6.35 mm). Rectangular photomask 22 has square corners 22a, 22b, 22c, 22d held in corresponding cutouts in flexible, chamfered edge protectors 24 located at the interior corners of box 20. Flexible, chamfered edge protectors 26 are located along the interior box side edges 20c, 20d and contact the side edges of the mask. Additional chamfered edge protectors 26 may be located along the upper and lower interior edges of box 22. Edge protectors 24, 26 have minimum contact with the photomask, space the photomask from the interior surfaces of the box, and prevent sliding of the mask within the box. Spaces exist between the photomask front and back surfaces and the corresponding box front and back sides 20a, 20b, and between the photomask side edges and the corresponding box side ends 20c, 20d. In addition to providing proper suspension of the photomask, the edge protectors 24, 26 reduce the volume of the interior of carrying box to reduce the amount of storage fluid. When introduced, the storage fluid 38 essentially fills the spaces in box 20 between the surfaces of photomask 22 and the interior surfaces of box 20, and contacts the front and back surfaces 22', 22" of the photomask. Box 20 should be constructed to withstand the internal and external pressures that it will experience, and the walls may be made of any suitable material such as a polymer, such as a low-outgassing polycarbonate, or a metal, such as stainless steel. The dimensions and materials should also preferably minimize electrostatic discharge (ESD) events, using conductive materials or other known practices.

In order to provide access, the box includes a cover or lid 28 which is normally sealed by a gasket made of a flexible polymer or other seal that is inert to the storage fluid. For insertion and removal of the photomask, lid 28 may be removed completely from the box 20 or may be connected by hinges. Clips or other securing means may be used to secure the lid in place.

The storage fluid may be filled into and drained from carrying box 20 by inlet or outlet ports 30 and 32, disposed on the upper and lower ends of the box, respectively. Ports 30, 32 each optionally contain a filter 34 to remove impurities from the storage fluid as it passes therethrough, and valve 36 to seal the openings. Other ports may be additionally provided to allow for fluid filling and draining. The box should be fluid-tight, to provide for long periods without recharging of the storage fluid.

The storage fluid is preferably a liquid such as water, but must be compatible, i.e., inert, with materials used in mask-making, such as quartz, chrome and MoSi. Trace additives, such as very dilute ammonia, aluminum chloride or potassium sulfate, may be added to make the storage fluid conductive to reduce ESD as well as tailor the zeta potential of the fluid. It is also preferable to tailor the zeta potentials to ensure that the particles do not stick to the surface of the mask. In addition, polymers such surfactants, flocculating agents, or chelating agents may be added to the water to ensure that particles do not stick to the surface of the mask. Surfactants could be beneficial because they would reduce the surface tension and viscosity of the solution and hence reduce the boundary layer at the surface of the mask making particle less likely to stick. Flocculants tend to change the surface properties of the particles making them more likely to stick to each other rather than the surface of the mask and which ultimately results in making a larger particle which would be easier to flush from the system. Similar to flocculating agents, chelating agents modify the surface charge of the certain types particles (without causing them to attract to each other) and hence allow a solution tailored for one zeta potential to work for other materials. For example, a basic solution is typically used to tailor the zeta potential such that silicon dioxide particles won't stick to the surface of masks. Metal particles, however, readily stick to the surface of a mask in basic solutions. Chelating molecules can be tailed to attach to the metal particles which then correspondingly changes the surface charge and hence prevents the metal particles from sticking to the surface of the mask. Additionally, films may be placed inside the box, between the box interior surfaces and the photomask, to take advantage of the zeta potential differences and attract the particles away from the mask surface. These films may be a simple film of aluminum oxide or something more complex such as a metal film with a constant charge to produce a voltage field to draw particles away from the mask surface. Both the storage fluid and films should be constructed so that zeta potential influence can be maximized to keep the mask surface clean.

In operation, lid 28 is removed from box 20, and photomask 22 is placed inside against lower edge pieces 24. The upper edge pieces are then inserted and the lid 28 sealed to the box. The storage fluid is preferably introduced slowly through lower port 32 to fill the spaces between the photomask and the box walls, without creating bubbles in the fluid. It may be desirable to introduce a fluid to modify the photomask surface first. For example, cleaning the mask with ozonated water or a dry UV/ozone clean renders the surface hydrophilic and consequently less likely to generate bubbles or adsorb particles. Similar treatments of the storage box may be necessary to modify the surface such that it is hydrophilic as well. Flushing the storage box with ozone would also have the added benefit of killing any bacteria that may be present in the source DI water supply that could potentially contaminate the mask during long term storage. In addition, the box (20) and photomask (22) may be simultaneously placed in a megasonics or ultrasonics system during this initial flushing to aid in the removal of any trace particles. One or more filters 34 at the inlet port 32 are provided to remove trace ionic species, organics, and particles in the storage fluid being introduced. As this is being done, valve 36 is opened in port 30 at the opposite, upper end of the box to evacuate any gas within the box and permit the storage fluid to fill the box completely, without trapped air pockets being formed. When all of the air is displaced by storage fluid, the valves 36 of both ports are closed, and the box then is a hermetically sealed storage and transport container for the photomask 22. The mask may remain in this state until required for exposure in a lithographic stepper.

When it is time to remove the mask from storage, before opening the reticle storage box a water source may first be introduced to the bottom of the box through port 32 to create sufficient fluid flow to remove and purge any particles that may have settled in the bottom of the box, and flush them out of the upper box port 30 opening. Lid 28 and upper edge pieces 24 are then removed, and the photomask is moved upward in direction 40 out of the storage fluid 38 and box 20, as shown in FIG. 5. In order to prevent droplet spotting on the surfaces 22', 22" of the photomask, a gas may be blown across the mask surface at the air/fluid interface **38*a*. A plurality of these nozzles 52 is provided, so that a gas may be blown over the entire front and back photomask surfaces. This exploits the Gibbs-Marangoni phenomenon, as described in U.S. Pat. No. 6,029,371 (the disclosure of which is hereby incorporated by reference), which is induced when there are two varying regions of surface tension in a fluid bath. Such effect has been applied to drying silicon wafers. In the instant invention, a drying gas comprising an organic solvent, for example, an alcohol-rich vapor such as isopropyl alcohol (IPA), is introduced through nozzles 52**. The drying gas preferably comprises IPA mixed with an inert gas such as nitrogen ($N_2$) at a concentration of between about 3% and 80% by volume IPA in the drying gas, at a temperature between about 80 and 170° C., more preferably between about 40 and 50% IPA at 100 to 120° C. (See Table 1 of U.S. Pat. No. 6,029,371 for the "good" drying gas.) On the mask surface the alcohol concentration is much higher, which results in a lower surface tension. Deeper below the surface of the storage fluid, the alcohol concentration is lower. This concentration difference is desirable and may be increased by maintaining fluid flow throughout the mask extraction to ensure that there is not time for the alcohol to diffuse into the fluid. The concentration difference also corresponds to a difference in surface tension between the two regions that, in turn, produces a flow away from the mask surface. This flow removes water and any residual particles from the surface of the mask. The water is forced away from the mask surface so that the mask can be introduced to the stepper's exposure chamber dry and free of particles. When mask exposure is complete, the mask can be returned to the fluid-filled storage container.

Thus, the present invention provides a system and method for storing and transporting photomasks that significantly reduces the development of mask surface contaminants, permits extended periods of storage without recharging of the storage fluid, and cleans the mask surfaces as it is removed from the storage fluid.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of storing and transporting a photomask comprising:

providing a photomask storage container having fluid-tight walls, at least one opening for moving the photomask into and out of the container, and a sealable inlet for a storage fluid;

placing the photomask in the storage container through the opening;

introducing a storage fluid into the container through the inlet, the storage fluid comprising a liquid essentially inert with respect to materials of the photomask;

closing the container opening; and sealing the storage fluid inlet.

2. The method of claim 1 further including providing a sealable fluid outlet for the storage container, and including expelling gas from the storage container as the storage fluid is introduced into the storage container and subsequently sealing the outlet.

3. The method of claim 1 including spacing the photomask from interior walls of the storage container to permit the storage fluid to maximize contact area with the surfaces of the photomask.

4. A method of storing and transporting a photomask comprising:
proving a photomask storage container having fluid-tight walls, at least one opening for moving the photomask into and out of the container, a sealable inlet for a storage fluid and a filter for the storage fluid;
placing the photomask in the storage container through the opening;
introducing a storage fluid into the container through the inlet;
filtering out contaminants from the storage fluid as the fluid is introduced into the storage container;
closing the container opening; and
sealing the storage fluid inlet.

5. The method of claim 4 wherein the filter is associated with the inlet.

6. A method of storing and transporting a photomask comprising;
providing a photomask storage container having fluid-tight walls, at least one opening for moving the photomask into and out of the container, and a sealable inlet for a storage fluid;
contacting a surface of the photomask with an agent to alter properties of the mask surface prior to introducing a storage fluid;
placing the photomask in the storage container through the opening;
introducing a storage fluid into the container through the inlet;
closing the container opening; and
sealing the storage fluid inlet.

7. A method of storing and transporting a photomask comprising:
providing a photomask storage container having fluid-tight walls, at least one opening for moving the photomask into and out of the container, and a sealable inlet for a storage fluid;
contacting a surface of the photomask with an agent to render the mask surface more hydrophilic;
placing the photomask in the storage container through the opening;
introducing a storage fluid into the container through the inlet;
closing the container opening; and
sealing the storage fluid inlet.

8. A method of storing and transporting a photomask comprising:
providing a photomask storage container having fluid-tight walls, at least one opening for moving the photomask into and out of the container, and a sealable inlet for a storage fluid;
contacting a surface of the photomask with an agent to alter zeta potential properties of the mask surface;
placing the photomask in the storage container through the opening;
introducing a storage fluid into the container through the inlet;
closing the container opening; and
sealing the storage fluid inlet.

9. A method of storing and transporting a photomask comprising:
providing a photomask storage container having fluid-tight walls, at least one opening for moving the photomask into and out of the container, and a sealable inlet for a storage fluid;
placing the photomask in the storage container through the opening;
introducing a storage fluid into the container through the inlet, the storage fluid comprising water;
closing the container opening; and
sealing the storage fluid inlet.

10. The method of claim 9 wherein the water includes additives to increase electrical conductivity or change surface properties of the water.

11. The method of claim 9 wherein the water includes additives selected from the group consisting of ammonia, potassium sulfate, aluminum chloride and combinations thereof.

12. A method of storing and transporting a photomask comprising:
providing a photomask storage container having fluid-tight walls, at least one opening for moving the photomask into and out of the container, and a sealable inlet for a storage fluid, the storage container further including a material attractive to photomask contaminants;
placing the photomask in the storage container through the opening;
introducing a storage fluid into the container through the inlet;
closing the container opening; and
sealing the storage fluid inlet.

13. The method of claim 12 including applying an electrical charge between the photomask and the attractive material to attract photomask contaminants to the material.

14. The method of claim 12 wherein the attractive material comprises aluminum oxide.

15. A method of storing and transporting a photomask comprising:
providing a photomask storage container having fluid-tight walls, at least one opening for moving the photomask into and out of the container, and a sealable inlet for a storage fluid;
placing the photomask in the storage container through the opening;
introducing a storage fluid into the container through the inlet;
closing the container opening;
sealing the storage fluid inlet;
opening the photomask opening; and
contacting a surface of the photomask with an alcohol-containing gas while removing the photomask from the storage container to remove the storage fluid from the photomask surface.

16. The method of claim 15 further including maintaining a flow of the alcohol-containing gas against the photomask surface during the removal of the photomask from the storage container.

17. The method of claim 15 further including maintaining a differential in concentration of the alcohol-containing gas between the mask surface and a distance below a surface of the storage fluid.

18. A method of transporting a photomask comprising:
providing a photomask storage container having fluid-tight walls and an opening for moving the photomask into and out of the container;

providing in the photomask storage container a photomask and a storage fluid around the photomask, the storage fluid being essentially inert with respect to the photomask;

opening the container opening; and contacting a surface of the photomask with an alcohol-containing gas while removing the photomask from the storage container to remove the storage fluid from the photomask surface.

19. The method of claim 18 further including maintaining a flow of the gas against the photomask surface during the removal of the photomask from the storage container.

20. The method of claim 18 further including maintaining a differential in concentration of the alcohol-containing gas between the mask surface and a distance below a surface of the storage fluid.

21. The method of claim 18 wherein there is further provided with the storage container a fluid port, and including introducing a liquid into the storage container prior to removing the photomask from the storage container to remove any particles that may have settled in the container.

22. The method of claim 18 including spacing the photomask from interior walls of the storage container to permit the storage fluid to maximize contact area with the surfaces of the photomask prior to removal.

23. The method of claim 18 wherein the storage fluid comprises a liquid.

24. The method of claim 18 wherein the storage fluid comprises water.

25. The method of claim 24 wherein the water includes additives to increase electrical conductivity or surface modification properties of the water.

26. The method of claim 24 wherein the water includes additives selected from the group consisting of ammonia, potassium sulfate, aluminum chloride and combinations thereof.

27. An apparatus for storing and transporting a photomask comprising a photomask storage container having fluid-tight walls, an opening for moving the photomask into and out of the container, and a sealable inlet for a storage liquid; a photomask in the storage container; and a storage liquid around the photomask, the storage liquid being essentially inert with respect to the photomask and essentially free of photomask contaminant, whereby the photomask may be placed in the storage container through the opening and the storage liquid may be introduced into the container through the inlet to provide an environment around the photomask essentially inert with respect to the photomask and essentially free of photomask contaminant.

28. The apparatus of claim 27 wherein the storage container further includes a sealable fluid outlet for expelling gas from the storage container as the storage liquid is introduced into the storage container.

29. The apparatus of claim 27 including edge protectors for spacing the photomask from interior walls of the storage container to permit the storage liquid to maximize contact area with the surfaces of the photomask.

30. An apparatus for storing and transporting a photomask comprising a photomask storage container having fluid-tight walls, an opening for moving the photomask into and out of the container, a sealable inlet for a storage fluid and a filter for filtering out contaminants from the storage fluid as the fluid is introduced into the storage container, whereby the photomask may be placed in the storage container through the opening and a storage fluid may be introduced into the container through the inlet to provide an environment around the photomask essentially inert with respect to the photomask and essentially free of photomask contaminant.

31. The apparatus of claim 30 wherein the filter is associated with the inlet.

* * * * *